United States Patent

Shimoda

[11] Patent Number: 6,003,153
[45] Date of Patent: Dec. 14, 1999

[54] MAXIMUM LIKELIHOOD DETECTION METHOD AND INFORMATION RECORDING AND REPRODUCING APPARATUS

[75] Inventor: Kaneyasu Shimoda, Kawasaki, Japan

[73] Assignee: Fujitsu Limited, Kawasaki, Japan

[21] Appl. No.: 08/771,015

[22] Filed: Dec. 20, 1996

[30]     Foreign Application Priority Data

Aug. 7, 1996 [JP] Japan .................................. 8-208303

[51] Int. Cl.⁶ ............................. G06F 11/10; G06F 23/02
[52] U.S. Cl. ......................... 714/792; 714/794; 375/262; 375/265
[58] Field of Search .................... 371/43.4, 43.6; 369/47; 714/786, 792, 794; 341/50, 58, 126; 375/229, 265

[56]         References Cited

U.S. PATENT DOCUMENTS 4,888,779  12/1989  Karabed et al. ...................... 371/43.4
5,548,600  8/1996  Fredrickson et al. .................. 371/43.4

OTHER PUBLICATIONS

Rae et al., "Design and Performance of a VLSI 120 Mb/s Trellis–Coded Partial Response Channel", IEEE Transactions on Magnetics, vol. 31, No. 2, pp. 1208–1214, Mar. 1995.

Primary Examiner—Alber De Cady
Assistant Examiner—Shelly A Chase
Attorney, Agent, or Firm—Greer, Burns & Crain, Ltd.

[57]             ABSTRACT

A maximum likelihood detection method detects a maximum likelihood path using trellis transitions when decoding a code string which is obtained by encoded data by a sliding block coding employing trellis-coded partial response (TCPR) technique. The maximum likelihood detection method includes the steps of (a) inputting the code string, and (b) detecting a maximum likelihood path with respect to the code string from state transition paths using a number of trellis transition states greater than a number of states of a state transition pattern of the sliding block code.

14 Claims, 14 Drawing Sheets

MAXIMUM LIKELIHOOD DETECTION METHOD AND INFORMATION RECORDING AND REPRODUCING APPARATUS

BACKGROUND OF THE INVENTION

The present invention generally relates to maximum likelihood detection methods and information recording and reproducing apparatuses, and more particularly to a maximum likelihood detection method which is suited for use in a partial response channel in which a trellis encoding is made and to an information recording and reproducing apparatus which employs such a maximum likelihood detection method.

In order to carry out high-density information recording and reproduction with respect to a magnetic disk, there is a known magnetic disk unit which employs the so-called partial response with maximum likelihood (PRML) technique which combines partial response and maximum likelihood detection. Recently, a trellis-coded partial response (TCPR) technique has been proposed which employs trellis encoding in the PRML technique so as to further improve the encoding gain.

In order to carry out the high-density information recording and reproduction with respect to the magnetic disk in the magnetic recording and reproducing apparatus, it is necessary to improve the data error rate in a state where the signal-to-noise (S/N) ratio is relatively poor. For this reason, it has recently become more and more important to record the information on the magnetic disk by adding an error correction code to the data. The TCPR technique combines to the partial response (1-D) channel a sliding block code which makes code values "0" and "1" correspond to the increase and decrease of the state, so that the hamming distance becomes larger than that in the case of the PRML technique and the error correction capability is improved.

The TCPR technique itself is proposed in Rae et al., "Design and Performance of a VLSI 120 Mb/s Trellis-Coded Partial Response Channel", IEEE Transactions on Magnetics, Vol.31, No.2, pp.1208–1214, March 1995, for example.

FIG. 1 is a system block diagram for explaining a conventional maximum likelihood detection method for a case where the TCPR technique is employed. In FIG. 1, a recording system of a magnetic disk unit includes a sliding block encoding circuit 501. On the other hand, a reproducing system of the magnetic disk unit includes a maximum likelihood detection circuit 511, a sliding block decoding circuit 512, and a code synchronizing circuit 513. The illustration of a magnetic disk and recording and reproducing heads is omitted in FIG. 1 for the sake of convenience. Instead, a path made up of the magnetic disk and the recording and reproducing heads is illustrated as a recording and reproducing (1-D) channel, that is, as a partial response (1-D) channel.

In FIG. 1, a numeral within brackets "{ }" indicates a state of the sliding block code, and it is assumed in this example for the sake of convenience that the sliding block code has 7 states {1} through {7}. As shown within the sliding block encoding circuit 501 and within the sliding block decoding circuit 512, when the state of the sliding block code is {4}, for example, the previous state is {5} if the previous code value is "0", and the previous state is {3} if the previous code value is "1". Similarly, when the state of the sliding block code is {4}, the next state is {3} if the present code value is "0" and the next state is {5} if the present code value is "1". However, when the state of the sliding block code is {1}, the previous code value can only be "0" and the previous state can only be {2}, and the present code value can only be "1" and the next state can only be {2}. In addition, when the state of the sliding block code is {7}, the previous code value can only be "1" and the previous state can only be {6}, and the present code value can only be "0" and the next state can only be {6}.

The state transition pattern of the sliding block code differs depending on whether the numeral indicating the state of the sliding block code is an odd number or an even number. For this reason, the maximum likelihood detection circuit 511 detects a maximum likelihood path from the state transitions by switching the state transition pattern depending on whether the numeral indicating the state of the sliding block code is an odd number or an even number. There are two kinds of state transition patterns P1 and P2, and these two state transition patterns P1 and P2 are alternately repeated. The switching of the state transition pattern is carried out based on a transition pattern switching signal received from the code synchronizing circuit 513. The sliding block decoding circuit 512 decodes a code string based on the code string from the maximum likelihood path detected by the maximum likelihood detection circuit 511 and a code conversion signal from the code synchronizing circuit 513.

The maximum likelihood detection circuit 511 detects the maximum likelihood path from the state transitions by switching the two kinds of state transition patterns P1 and P2 which are alternately repeated. In other words, the maximum likelihood detection circuit 511 detects the maximum likelihood path using the same number of states of trellis transitions as the number of states of the sliding block code. Consequently, it is necessary to synchronize the code string and the maximum likelihood detection circuit 511 before starting the detection of the maximum likelihood path. More particularly, it is necessary for the code synchronizing circuit 513 to detect a synchronizing word from the code string which is obtained from the recording and reproducing (1-D) channel, and to output the transition pattern switching signal to the maximum likelihood detection circuit 511 based on the detected synchronizing word.

Therefore, although the recording system adds the error correction code to the code string so that the error correction process can be made in the reproducing system, the maximum likelihood path cannot be detected in the maximum likelihood detection circuit 511 unless the synchronizing word of the code string is first reproduced. As a result, there was a problem in that the error correction process cannot be made with respect to the synchronizing word. In addition, since the conventional maximum likelihood detection method cannot carry out the error correction process with respect to the synchronizing word, there was a problem in that it is extremely difficult to further reduce the data error rate and to improve the reliability of the information recording and reproduction.

SUMMARY OF THE INVENTION

Accordingly, it is a general object of the present invention to provide a novel and useful maximum likelihood detection method and information recording and reproducing apparatus, in which the problems described above are eliminated.

Another and more specific object of the present invention is to provide a maximum likelihood detection methods and information recording and reproducing apparatus, which can also carry out an error correction process with respect to a synchronizing word of a code string, so that the data error rate is further reduced and the reliability of the information recording and reproduction is further improved.

Still another object of the present invention is to provide a maximum likelihood detection method for detecting a maximum likelihood path using trellis transitions when decoding a code string which is obtained by encoded data by a sliding block coding employing TCPR technique, comprising the steps of (a) inputting the code string, and (b) detecting a maximum likelihood path with respect to the code string from state transition paths using a number of trellis transition states greater than a number of states of a state transition pattern of the sliding block code. According to the maximum likelihood detection method of the present invention, it is also possible to carry out an error correction process with respect to a synchronizing word of the code string. As a result, it is possible to further reduce the data error rate and improve the reliability of the information recording and reproduction.

A further object of the present invention is to provide an information recording and reproducing apparatus comprising encoding means for encoding data by a sliding block code employing TCPR technique and outputting a code string, recording and reproducing means for recording the code string on a recording medium and reproducing the code string from the recording medium, maximum likelihood detection means for detecting a maximum likelihood path from state transition paths using a number of trellis transition states greater than a number of states of a state transitions pattern of the sliding block code used in the encoding means with respect to the code string reproduced from the recording medium by the recording and reproducing means, and decoding means for decoding the code string from the maximum likelihood path detected by the maximum likelihood detection means and outputting decoded data. According to the information recording and reproducing apparatus of the present invention, it is possible to detect the maximum likelihood path using a relatively simple circuit construction. In addition, it is possible to further reduce the data error rate and improve the reliability of the information recording and reproduction because an error correction process can also be carried out with respect to a synchronizing word of the code string.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention.

Figure 2:
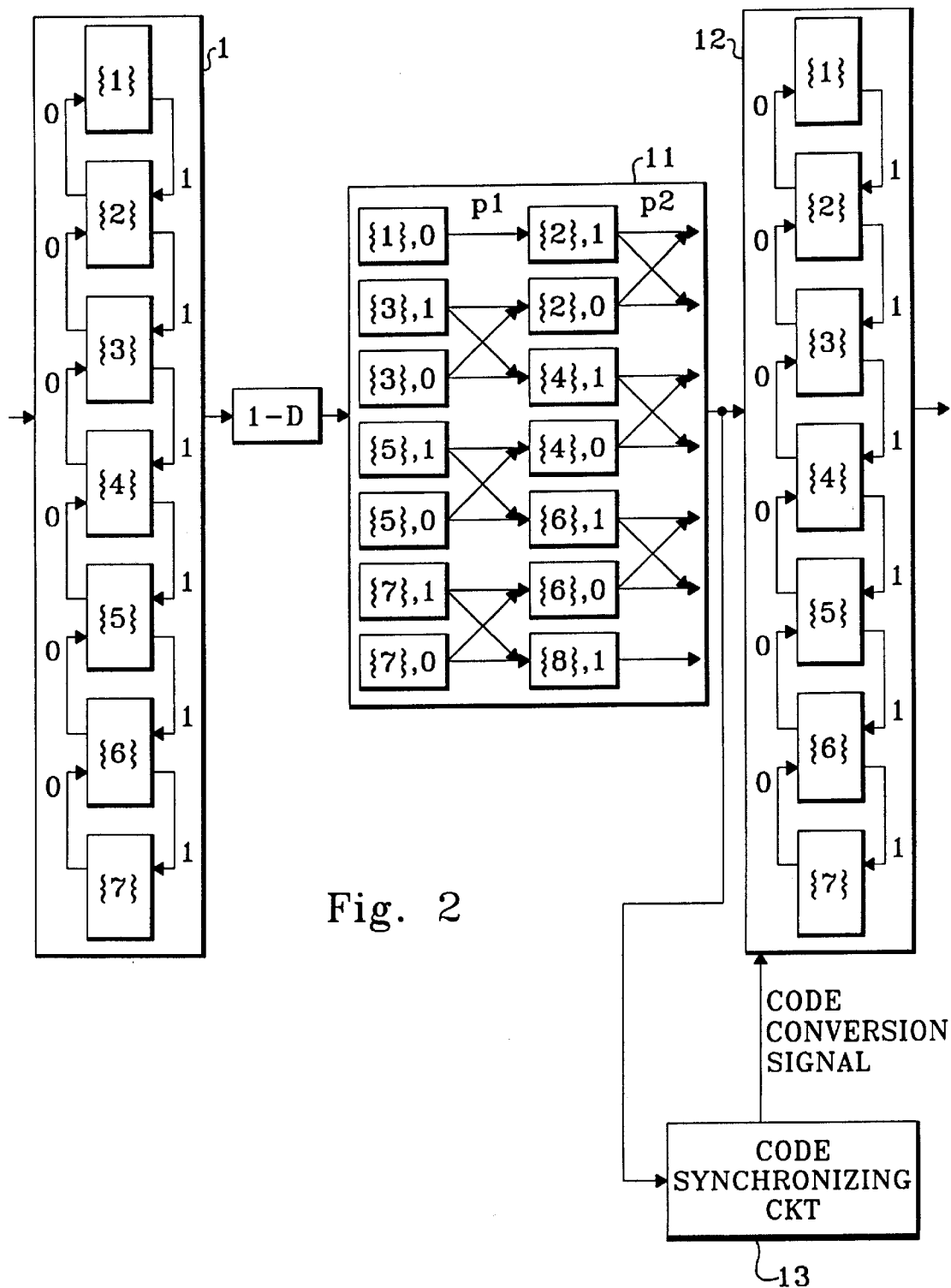
FIG. 2 is a system block diagram showing the general construction of an information recording and reproducing apparatus employing a maximum likelihood detection method according to the present invention.

FIG. 2 is a system block diagram showing the general construction of an information recording and reproducing apparatus employing a maximum likelihood detection method according to the present invention. In FIG. 2, a recording system of the information recording and reproducing system employing the TCPR technique includes a sliding block encoding circuit 1. On the other hand, a reproducing system of the information recording and reproducing apparatus includes a maximum likelihood detection circuit 11, a sliding block decoding circuit 12, and a code synchronizing circuit 13. The illustration of a magnetic disk and recording and reproducing heads is omitted in FIG. 2 for the sake of convenience. Instead, a path made up of the magnetic disk and the recording and reproducing heads is illustrated as a recording and reproducing (1-D) channel, that is, as a partial response (1-D) channel.

In FIG. 2, a numeral within brackets "{ }" indicates a state of the sliding block code, and it is assumed in this case for the sake of convenience that the sliding block code has 7 states {1} through {7}. As shown within the sliding block encoding circuit 1 and within the sliding block decoding circuit 12, when the state of the sliding block code is {4}, for example, the previous state is {5} if the previous code value is "0" and the previous state is {3} if the previous code value is "1". Similarly, when the state of the sliding block code is {4}, the next state is {3} if the present code value is "0" and the next state is {5} if the present code value is "1". However, when the state of the sliding block code is {1}, the previous code value can only be "0" and the previous state can only be {2}, and the present code value can only be "1" and the next state can only be {2}. In addition, when the state of the sliding block code is {7}, the previous code value can only be "1" and the previous state can only be {6}, and the present code value can only be "0" and the next state can only be {6}.

The actual state transition pattern of the sliding block code is determined depending on whether the numeral indicating the state of the sliding block code is an odd number or an even number. For this reason, the maximum likelihood detection circuit 11 is originally required to detect the maximum likelihood path from the state transitions by switching the state transition pattern depending on whether the numeral indicating the state of the sliding block pattern is an odd number or an even number.

Figure 1:
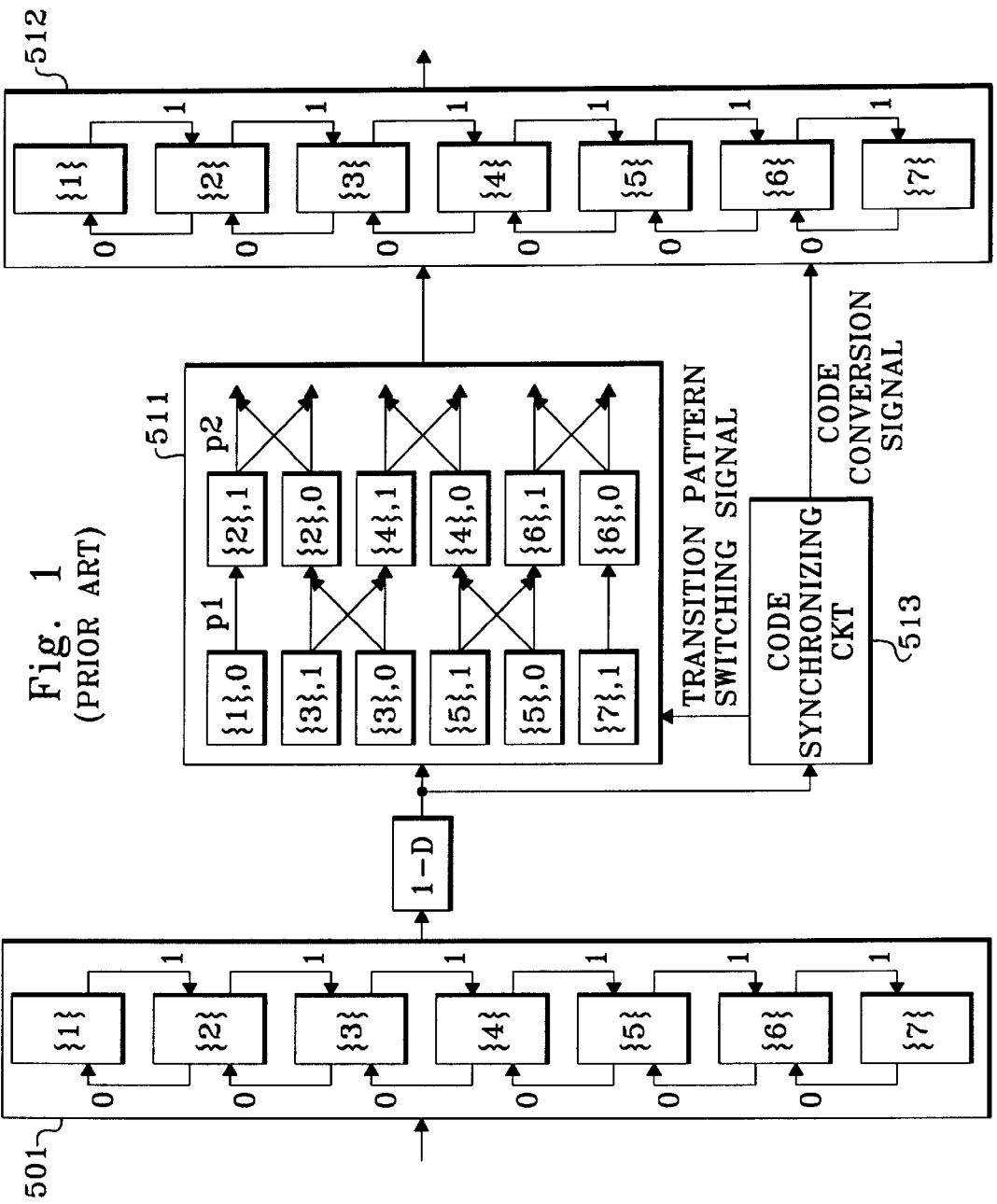
FIG. 1 is a system block diagram for explaining a conventional maximum likelihood detection method employing a TCPR technique.

However, in the present invention, the maximum likelihood detection circuit 11 detects the maximum likelihood path from the state transition paths by using a number of trellis transition states greater than the number of states of the sliding block code. In the particular case shown in FIG. 2, the number of states of the sliding block code is 7, and the number of trellis transitions used by the maximum likelihood detection circuit 11 is 8. As may be seen by comparing FIG. 2 and FIG. 1 described above, state transitions "{7}, 0" and "{8}, 1" are added at the lowermost portion within the maximum likelihood detection circuit 11 as shown in FIG. 2. These added state transitions actually cannot exist, but by providing these virtual state transitions, the switching of the state transition patterns p1 and p2 becomes unnecessary.

For this reason, there is no need to synchronize the code string and the maximum likelihood detection circuit 11 before starting the detection of the maximum likelihood path, and the conversion timing of the sliding block code can be extracted after detecting the maximum likelihood path. In other words, by adding the error correction code to the code string in the recording system, it becomes possible to carry out the error correction process in the reproducing system with respect to the code string including the synchronizing word, and the data error rate can be further reduced.

The sliding block decoding circuit 12 decodes the code string based on the code string from the maximum likelihood path detected by the maximum likelihood detection circuit 11 and the code conversion signal which is obtained from the code synchronizing circuit 13 and indicates the code conversion timing, that is, the code decoding timing.

A description will now be given of a first embodiment of the information recording and reproducing apparatus according to the present invention. This first embodiment of the information recording and reproducing apparatus employs a first embodiment of a maximum likelihood detection method according to the present invention. In addition, in this first embodiment of the information recording and reproducing apparatus, the present invention is applied to a magnetic disk unit.

The basic construction of the first embodiment of the information recording and reproducing apparatus is the same as that shown in FIG. 2. As shown in FIG. 2, the recording system of the information recording and reproducing system employing the TCPR technique includes the sliding block encoding circuit 1. On the other hand, the reproducing system of the information recording and reproducing apparatus includes the maximum likelihood detection circuit 11, the sliding block decoding circuit 12, and the code synchronizing circuit 13. The illustration of the magnetic disk and the recording and reproducing heads is omitted in FIG. 2 for the sake of convenience. Instead, the path made up of the magnetic disk and the recording and reproducing heads is illustrated as the recording and reproducing (1-D) channel, that is, as the partial response (1-D) channel.

The maximum likelihood detection circuit 11 detects the maximum likelihood path from the state transition paths by using a number of trellis transition states greater than the number of states of the sliding block code. In this embodiment, the number of states of the sliding block code is 7, and the number of trellis transitions used by the maximum likelihood detection circuit 11 is 8. As may be seen by comparing FIG. 2 and FIG. 1 described above, state transitions "{7}, 0" and "{8}, 1" are added at the lowermost portion within the maximum likelihood detection circuit 11 as shown in FIG. 2. These added state transitions actually cannot exist, but by providing these virtual state transitions, the switching of the state transition patterns p1 and p2 becomes unnecessary.

Figure 3:
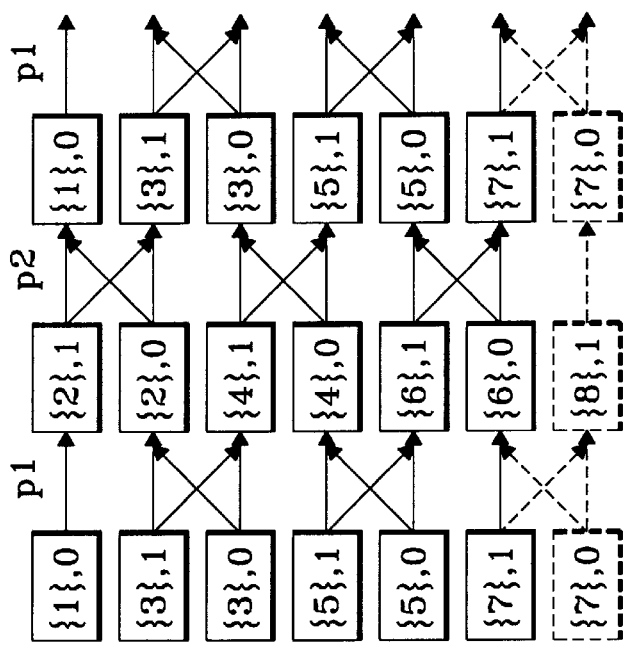
FIG. 3 is a diagram showing state transitions for a case where a maximum likelihood detection with respect to a code string in a maximum likelihood detection circuit starts from a state transition pattern p1.
Figure 4:
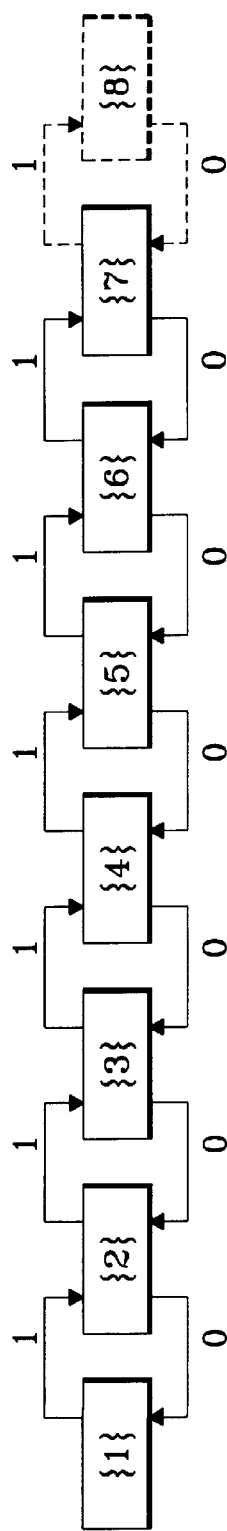
FIG. 4 is a diagram showing 7 states of a sliding block code, indicated by a solid line, detected by the maximum likelihood path.

FIG. 3 is a diagram showing state transitions for a case where the detection of the maximum likelihood path with respect to the code string in the maximum likelihood detection circuit 11 starts from the state transition pattern p1. In this case, the maximum likelihood path is determined from the state transitions indicated by a solid line in FIG. 3. Accordingly, although the number of trellis transitions used by the maximum likelihood detection circuit 11 is 8, the maximum likelihood path is actually detected with respect to the 7 states of the sliding block code indicated by a solid line in FIG. 4.

Figure 5:
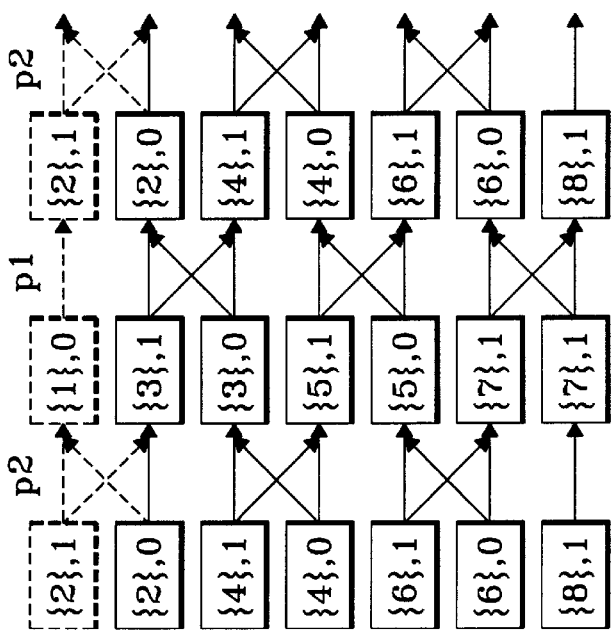
FIG. 5 is a diagram showing state transitions for a case where the maximum likelihood detection with respect to the code string in the maximum likelihood detection circuit starts from a state transition pattern p2.
Figure 6:
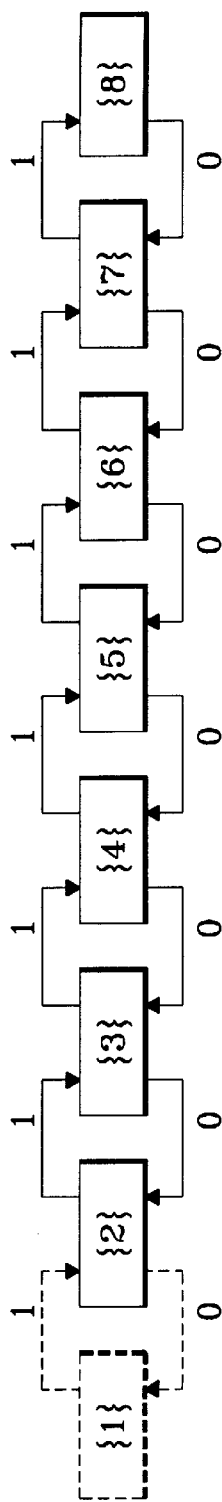
FIG. 6 is a diagram showing 7 states of the sliding block code, indicated by a solid line, detected by the maximum likelihood path.

FIG. 5 is a diagram showing state transitions for a case where the detection of the maximum likelihood path with respect to the code string in the maximum likelihood detection circuit 11 starts from the state transition pattern p2. In this case, the maximum likelihood path is determined from the state transitions indicated by a solid line in FIG. 5. Accordingly, although the number of trellis transitions used by the maximum likelihood detection circuit 11 is 8, the maximum likelihood path is actually detected with respect to the 7 states of the sliding block code indicated by a solid line in FIG. 6.

For this reason, there is no need to synchronize the code string and the maximum likelihood detection circuit 11 before starting the detection of the maximum likelihood path, and the conversion timing of the sliding block code can be extracted after detecting the maximum likelihood path. In other words, by adding the error correction code to the code string in the recording system, it becomes possible to carry out the error correction process in the reproducing system with respect to the code string including the synchronizing word, and the data error rate can be further reduced.

The code synchronizing circuit 13 generates the code conversion signal from the code string from the maximum likelihood path detected by the maximum likelihood detection circuit 11, and this code conversion signal indicates the code conversion timing, that is, the code decoding timing. The sliding block decoding circuit 12 decodes the code string based on the code string from the maximum likelihood path detected by the maximum likelihood detection circuit 11 and the code conversion signal which is obtained from the code synchronizing circuit 13.

Figure 7:
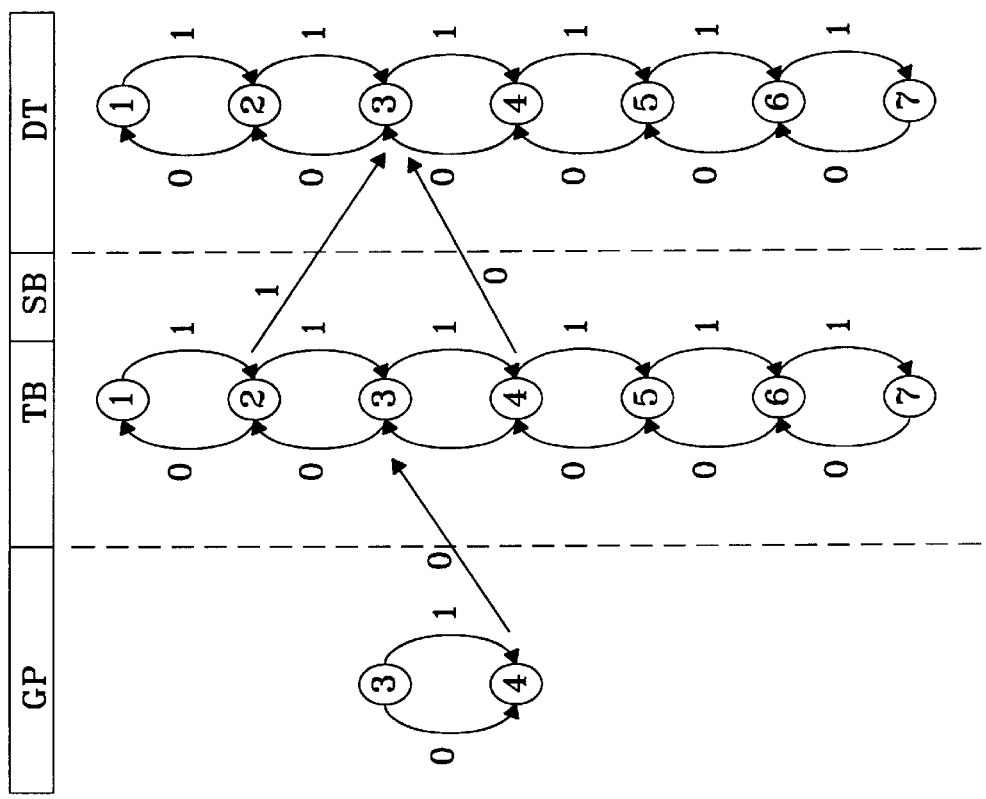
FIG. 7 is a diagram showing a data format of data recorded on a magnetic disk.

FIG. 7 is a diagram showing a data format of the data recorded on the magnetic disk (not shown). The data format shown in FIG. 7 includes a gap GP, training signal bits TB of an equalizer (not shown) of the reproducing system, synchronizing bits SB, and data DT. The information GP, TB, SB and DT are all recorded on the magnetic disk so as to satisfy the rules of the trellis code, and thus, the recording system may be identical to that of the conventional magnetic disk unit employing the TCPR technique. FIG. 7 shows a particular case where the maximum likelihood detection of the maximum likelihood detection circuit 11 is initialized in synchronism with the pattern of the gap GP.

Next, a description will be given of the construction of the maximum likelihood detection circuit 11. As described above, the sliding block code has 7 states in this embodiment, and this embodiment detects the maximum likelihood path in the maximum likelihood detection circuit 11 from the state transition paths using 8 trellis transition states which is larger than the 7 states of the sliding block code. However, for the sake of convenience, a description will be given of the construction of the maximum likelihood detection circuit 11 for a case where the sliding block code has 5 states and the maximum likelihood path is detected from the state transition paths using 6 trellis transition states which is larger than the 5 states of the sliding block code, so as to simplify the description.

Figure 12:
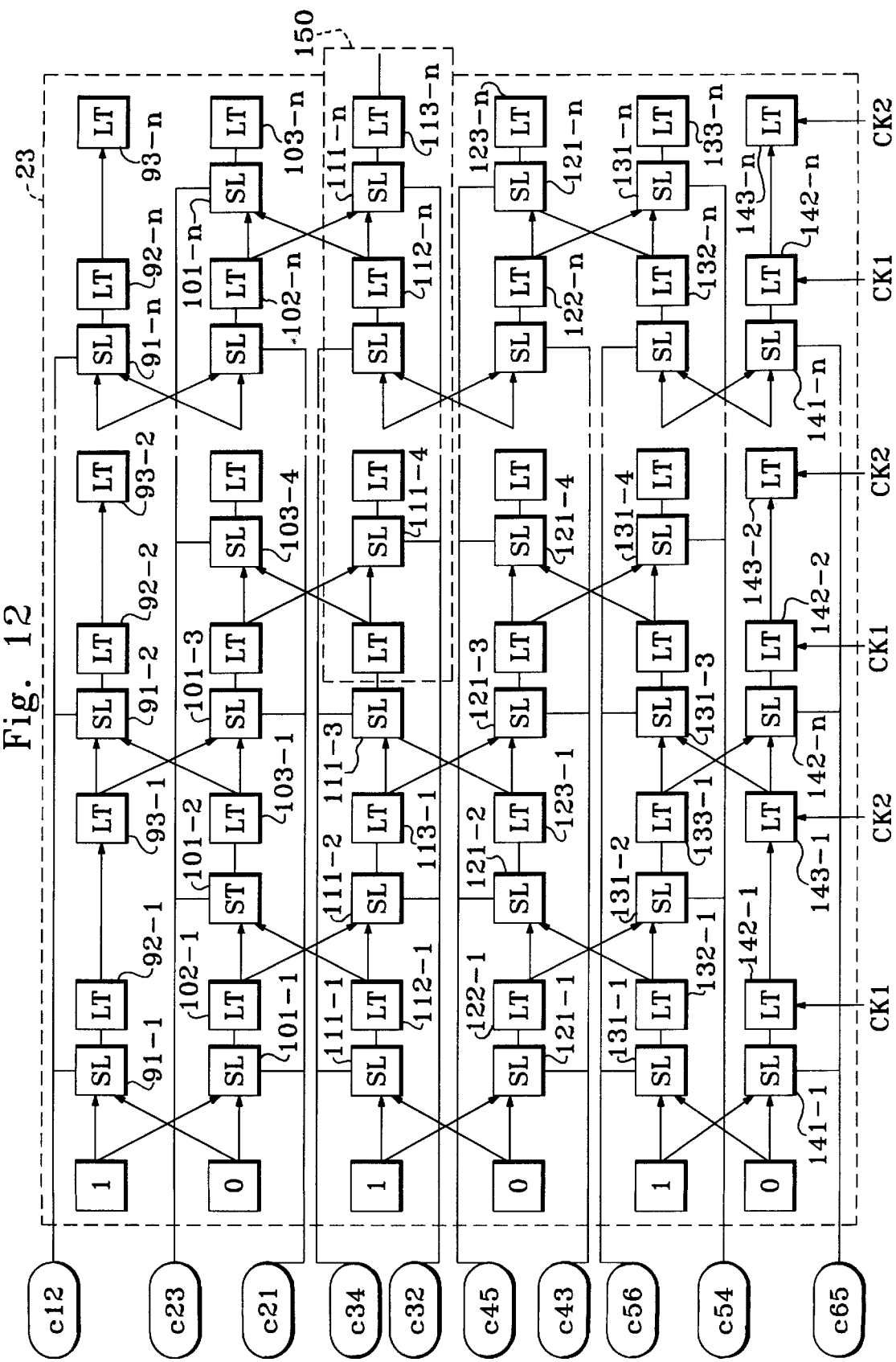
FIG. 12 is a system block diagram showing the construction of a path memory unit.

In this case, the maximum likelihood detection circuit 11 generally includes a branch metric distributor (hereinafter simply referred to as a distributor) 21, a path judging unit 22, and a path memory unit 23. The distributor 21 and the path judging unit 22 are constructed as shown in FIG. 8, and the path memory unit 23 is constructed as shown in FIG. 12 which will be described later.

Figure 8:
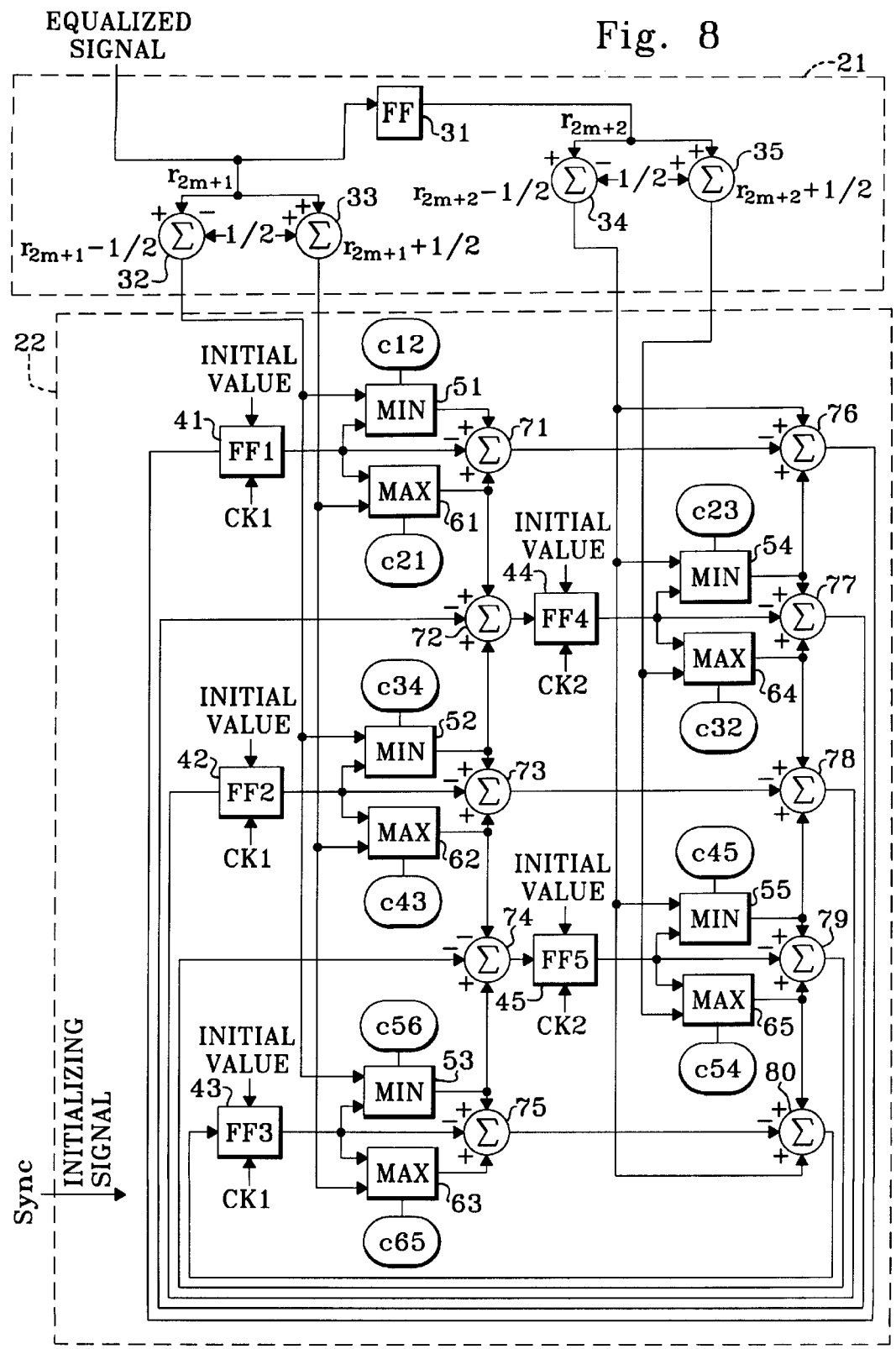
FIG. 8 is a system block diagram showing the construction of a distributor and a path judging unit.

In FIG. 8, the distributor 21 includes a flip-flop 31, and adders 32 through 35 which are connected as shown. On the other hand, the path judging unit 22 includes flip-flops 41 through 45, minimum value output circuits 51 through 55, maximum value output circuits 61 through 65, and adders 71 through 80 which are connected as shown in FIG. 8.

The code string (equalized signal $r_{2m+1}$) obtained from the recording and reproducing (1-D) channel is supplied to the flip-flop 31 and the adders 32 and 33 within the distributor 21. An output signal $r_{2m+1}-\frac{1}{2}$ of the adder 32 is supplied to the minimum value output circuits 51 through 53 within the path judging unit 22, and an output signal $r_{2m+1}+\frac{1}{2}$ of the adder 33 is supplied to the maximum value output circuits 61 through 63 within the path judging unit 22. On the other hand, an output signal $r_{2m+2}$ of the flip-flop 31 within the distributor 21 is supplied to the adders 34 and 35, and output signal $r_{2m+2}-\frac{1}{2}$ of the adder 34 is supplied to the minimum value output circuits 54 and 55 within the path judging unit 22, and an output signal $r_{2m+2}+\frac{1}{2}$ of the adder 35 is supplied to the maximum value output circuits 64 and 65 within the path judging unit 22.

The minimum value output circuit 51 and the maximum value output circuit 61 also receive an output signal of the flip-flop 41, and output signals of the minimum value output circuit 51 and the maximum value output circuit 61 are supplied to the adder 71 together with the output signal of the flip-flop 41.

Figure 9:
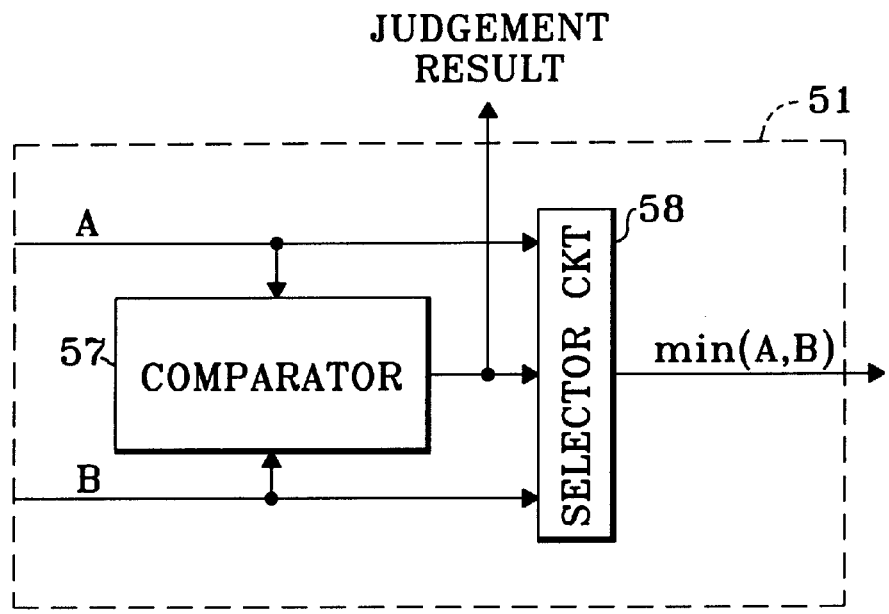
FIG. 9 is a system block diagram showing the construction of a minimum value output circuit.

The minimum value output circuit 51 has the construction shown in FIG. 9. In FIG. 9, a comparator 57 compares 2 inputs A and B, and supplies a judgement result to a selector circuit 58. The selector circuit 58 also receive the 2 inputs A and B, and a smaller one of the inputs A and B is output as a minimum value min(A, B) based on the judgement result from the comparator 57. The minimum value output circuits 52 through 55 have constructions similar to that of the minimum value output circuit 51.

Figure 10:
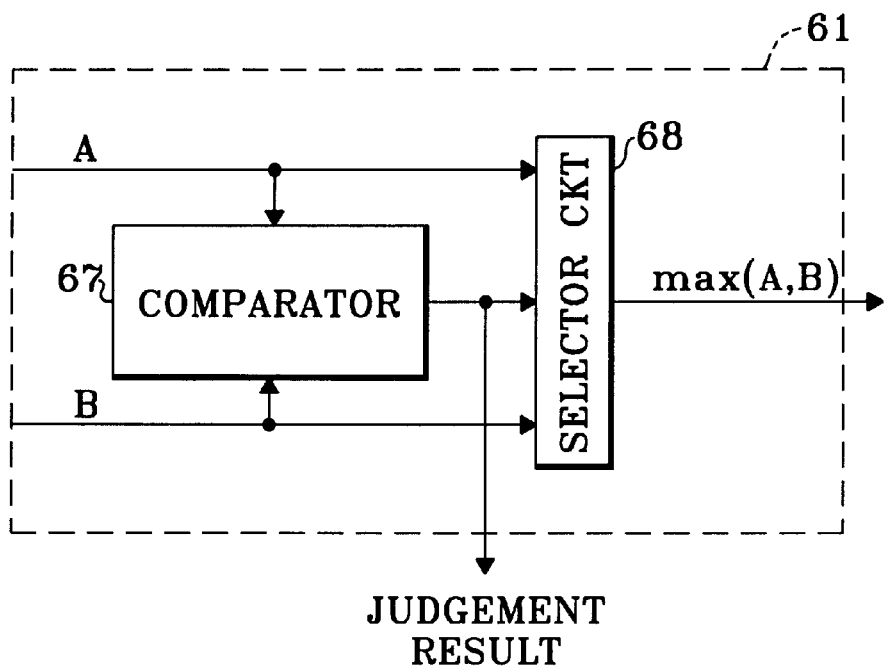
FIG. 10 is a system block diagram showing the construction of a maximum value output circuit.

On the other hand, the maximum value output circuit 61 has the construction shown in FIG. 10. In FIG. 10, a comparator 67 compares 2 inputs A and B, and supplies a judgement result to a selector circuit 68. The selector circuit 68 also receive the 2 inputs A and B, and a larger one of the inputs A and B is output as a maximum value max(A, B) based on the judgement result from the comparator 67. The maximum value output circuits 62 through 65 have constructions similar to that of the maximum value output circuit 61.

The minimum value output circuit 52 and the maximum value output circuit 62 also receive an output signal of the flip-flop 42, and output signals of the minimum value output circuit 52 and the maximum value output circuit 62 are supplied to the adder 73 together with the output signal of the flip-flop 42. The minimum value output circuit 53 and the maximum value output circuit 63 also receive an output signal of the flip-flop 43, and output signals of the minimum value output circuit 53 and the maximum value output circuit 63 are supplied to the adder 75 together with the output signal of the flip-flop 43. The minimum value output circuit 54 and the maximum value output circuit 64 also receive an output signal of the flip-flop 44, and output signals of the minimum value output circuit 54 and the maximum value output circuit 64 are supplied to the adder 77 together with the output signal of the flip-flop 44. The minimum value output circuit 55 and the maximum value output circuit 65 also receive an output signal of the flip-flop 45, and output signals of the minimum value output circuit 55 and the maximum value output circuit 65 are supplied to the adder 79 together with the output signal of the flip-flop 45.

The adder 72 adds output signals of the adders 71, 73 and 77, and supplies an added result to the flip-flop 44. The adder 74 adds output signals of the adders 73, 75 and 79, and supplies an added result to the flip-flop 45. The adder 76 adds output signals of the adders 34 and 71 and the minimum value output circuit 54, and supplies an added result to the flip-flop 41. The adder 78 adds output signals of the adder 73, the minimum value output circuit 55 and the maximum value output circuit 64, and supplies an added result to the flip-flop 42. The adder 80 adds output signals of the adders 34 and 75 and the maximum value output circuit 65, and supplies an added result to the flip-flop 43.

A clock CK1 which will be described later is supplied to the flip-flops 41 through 43, and a clock CK2 which has a phase different from that of the clock CK1 is supplied to the flip-flops 44 and 45. In addition, appropriate initial values are also supplied to the flip-flops 41 through 45, and the flip-flops 41 through 45 are initialized when the synchronization detection is made as will be described later. Furthermore, judgement results c12, c34, c56, c23 and c45 which are obtained from the minimum value output circuits 51 through 55 are supplied to the path memory unit 23 shown in FIG. 12 which will be described later. Judgement results c21, c43, c65, c32 and c54 which are obtained from the maximum value output circuits 61 through 65 are also supplied to the path memory unit 23 shown in FIG. 12.

Figure 11:
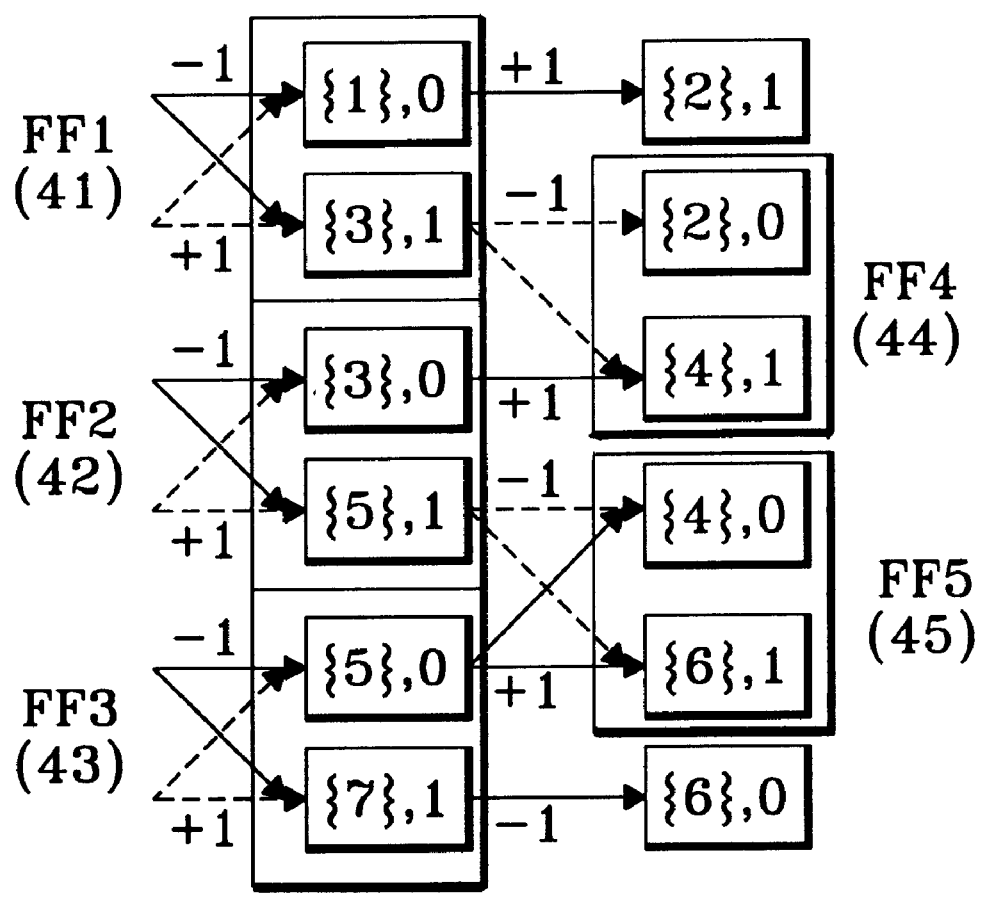
FIG. 11 is a diagram schematically showing the relationship of flip-flops and state transition patterns.

FIG. 11 is a diagram schematically showing the relationship of the flip-flops 41 through 45 and the state transition patterns. As shown in FIG. 11, the path judging unit 22 can detect the maximum likelihood path from the state transition paths using 6 trellis transition states.

The path memory unit 23 includes selectors 91-1 through 91-n, 101-1 through 101-n, 111-1 through 111-n, 121-1 through 121-n, 131-1 through 131-n and 141-1 through 141-n, and latch circuits 92-1 through 92-n, 93-1 through 93-n, 102-1 through 102-n, 103-1 through 103-n, 112-1 through 112-n, 113-1 through 131-n, 122-1 through 122-n, 123-1 through 123-n, 132-1 through 132-n, 133-1 through 133-n, 142-1 through 142-n and 143-1 through 143-n which are connected as shown in FIG. 12. The clock CK1 is supplied to the latch circuits 92-1 through 92-n, 102-1 through 102-n, 112-1 through 112-n, 122-1 through 122-n, 132-1 through 132-n and 142-1 through 142-n. On the other hand, the clock CK2 is supplied to the latch circuits 93-1 through 93-n, 103-1 through 103-n, 113-1 through 131-n, 123-1 through 123-n, 133-1 through 133-n and 143-1 through 143-n.

The judgement result c12 from the minimum value output circuit 51 is supplied to the selectors 91-1 through 91-n. The judgement result c23 from the minimum value output circuit 54 is supplied to the selectors 101-2, 101-4, . . . , and 101-n, and the judgement result c21 from the maximum value output circuit 61 is supplied to the selectors 101-1, 101-3, . . . , and 101-n-1. The judgement result c34 from the minimum value output circuit 52 is supplied to the selectors 111-1, 111-3, . . . , and 111-n-1, and the judgement result c32 from the maximum value output circuit 64 is supplied to the selectors 111-2, 11-4, . . . , and 111-n. The judgement result c45 from the minimum value output circuit 55 is supplied to the selectors 121-2, 121-4, . . . , and 121-n, and the judgement result c43 from the maximum value output circuit 62 is supplied to the selectors 121-1, 121-3, . . . , and 121-n-1. The judgement result c56 from the minimum value output circuit 53 is supplied to the selectors 131-1, 131-3, . . . , and 131-n-1, and the judgement result c54 from the maximum value output circuit 65 is supplied to the selectors 131-2, 131-4, . . . , and 131-n. The judgement result c65 from the minimum value output circuit 63 is supplied to the selectors 141-1, 141-2, . . . , and 141-n.

Figure 13:
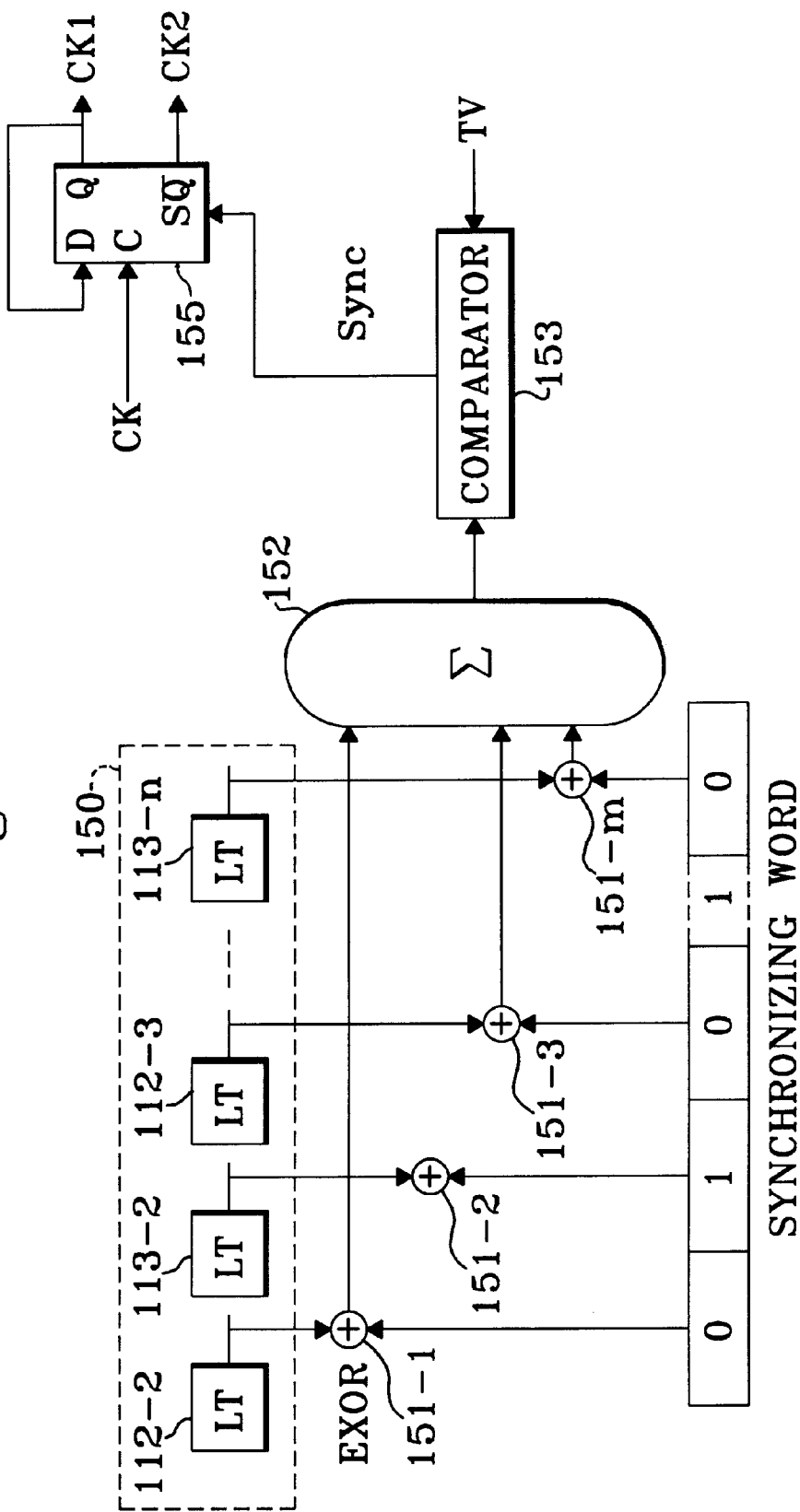
FIG. 13 is a circuit diagram showing the construction of a clock generating circuit.

Next, a description will be given of a clock generating circuit which generates the clocks CK1 and CK2 used within the maximum likelihood detection circuit 11. FIG. 13 is a circuit diagram showing the construction of the clock generating circuit. This clock generating circuit includes a synchronization detection circuit 150 which is indicated by a dotted line in FIG. 12, exclusive-OR circuits 151-1 through 151-m, an adder 152, a comparator 153, and a counter 155 which are connected as shown in FIG. 13. An output of a corresponding one of the latch circuits 112-2 through 113-n of the synchronization detection circuit 150 and a corresponding bit of the synchronizing word are supplied to each of the exclusive-OR circuits 151-1 through 151-m. The adder 152 adds outputs of the exclusive-OR circuits 151-1 through 151-m. The comparator 153 compares an output of the adder 152 and a hamming distance tolerance value TV, and outputs a synchronization detection signal Sync based on a comparison result. The synchronization detection signal Sync is supplied to a set terminal S of the counter 155. A clock signal CK is supplied to a clock terminal C of this counter 155, and a Q-output of this counter 155 is fed back to a data terminal D of this counter 155. The Q-output of the counter 155 is output as the clock CK1, and a /Q-output of the counter 155 is output as the clock CK2.

In FIG. 13, the synchronization detection circuit 150 is made up of the latch circuits 112-2 through 113-n, and the output of the latch circuit 113-n is supplied to the sliding block decoding circuit 12 and the code synchronizing circuit 13 as the maximum likelihood output. However, if n is sufficiently large, it is of course possible to supply the output of another latch circuit such as the latch circuit 123-n to the sliding block decoding circuit 12 and the code synchronizing circuit 13 as the maximum likelihood output. Furthermore, the synchronization detection signal Sync can also be generated based on the outputs of the latch circuits provided in a row different from the row in which the latch circuits 112-2 through 113-n are provided.

In addition, the clock generating circuit shown in FIG. 13 may be provided within the maximum likelihood detection circuit 11 or, provided independently of the maximum likelihood detection circuit 11. When providing the clock generating circuit independently of the maximum likelihood detection circuit 11, the clock generating circuit may be provided within the code synchronizing circuit 13 show in FIG. 2, for example.

Therefore, according to the maximum likelihood detection circuit 11 described above in conjunction with FIGS. 8 through 12, the maximum likelihood path is detected from the state transition paths using 6 trellis transition states, but the path metric is held in the form of the difference, and the metric value is held by 5 flip-flops 41 through 45. When the synchronization is detected, the flip-flops holding the metric value are initialized, and the counter 155 which generates the clocks CK1 and CK2 having the two phases is set in response to the synchronization detection signal Sync.

Next, a description will be given of a second embodiment of the information recording and reproducing apparatus according to the present invention. This second embodiment of the information recording and reproducing apparatus employs a second embodiment of the maximum likelihood detection method according to the present invention. In this second embodiment of the information recording and reproducing apparatus, the present invention is applied to the magnetic disk unit.

Figure 14:
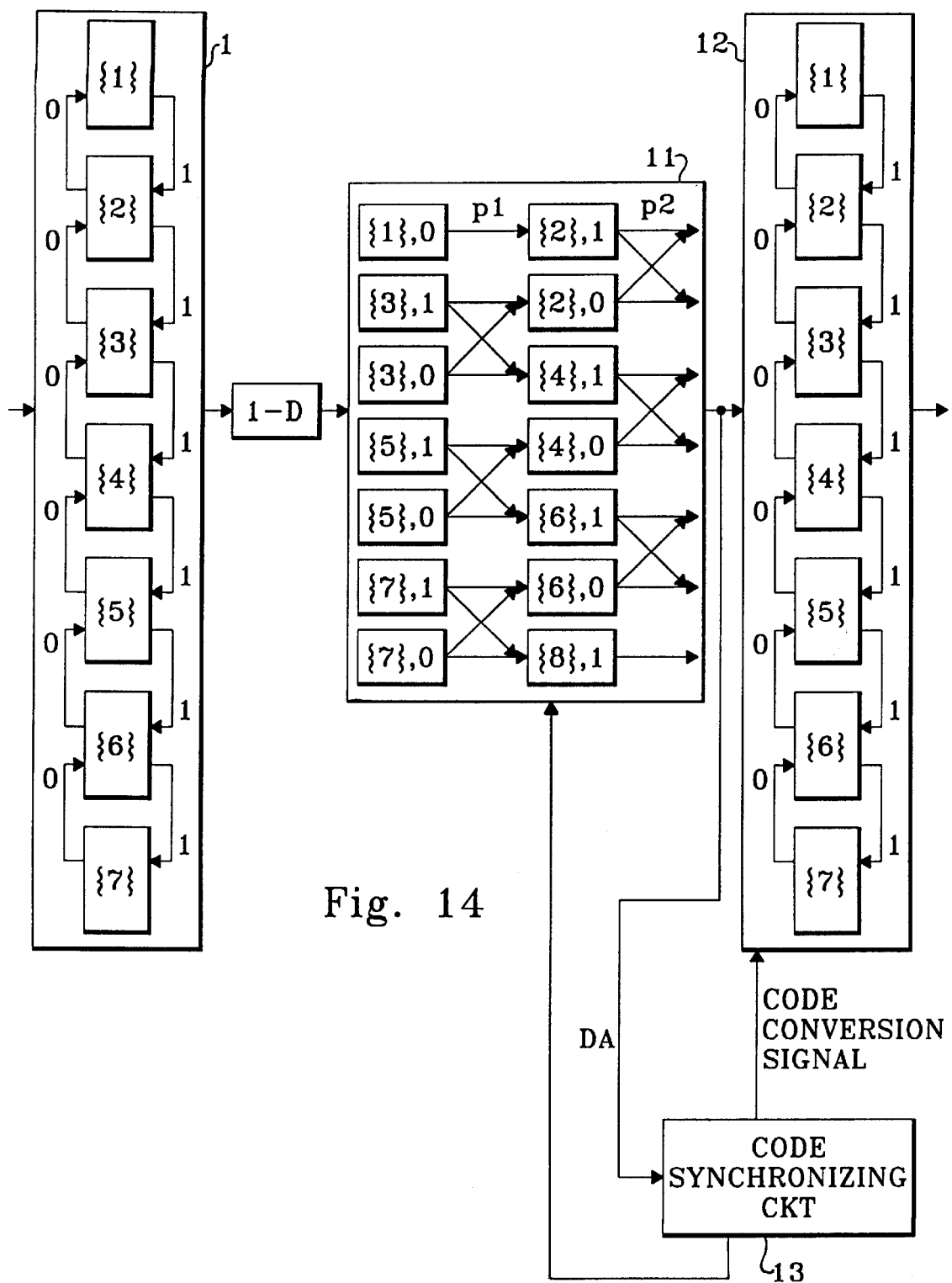
FIG. 14 is a system block diagram showing the construction of a second embodiment of an information recording and reproducing apparatus according to the present invention.

FIG. 14 is a system block diagram showing the second embodiment of the information recording and reproducing apparatus. In FIG. 14, those parts which are the same as those corresponding parts in FIG. 2 are designated by the same reference numerals, and a description thereof will be omitted.

In this embodiment, when the synchronization is detected, the code synchronizing circuit 13 supplies a disable signal DA to the maximum likelihood detection circuit 11 so as to delete a state transition path which is no longer necessary. More particularly, it is possible to disable a corresponding circuit portion within the path judging unit 22 shown in FIG. 8 or, disable a corresponding circuit portion such as the latch circuits within the path memory unit 23 shown in FIG. 12, for example. As a result, the paths indicated by the dotted line are deleted in the case shown in FIG. 3, and the paths indicated by the dotted line are deleted in the case shown in FIG. 5. Hence, according to this embodiment, it is possible to prevent unwanted noise from propagating to circuit stages at and after the maximum likelihood detection circuit 11 by deleting the virtual state transition paths which actually do not exist after the synchronization detection, and the reliability of the magnetic disk unit is further improved.

Next, a description will be given of a third embodiment of the information recording and reproducing apparatus according to the present invention. This third embodiment of the information recording and reproducing apparatus employs a third embodiment of the maximum likelihood detection method according to the present invention. In this third embodiment of the information recording and reproducing apparatus, the present invention is applied to the magnetic disk unit.

Figure 15:
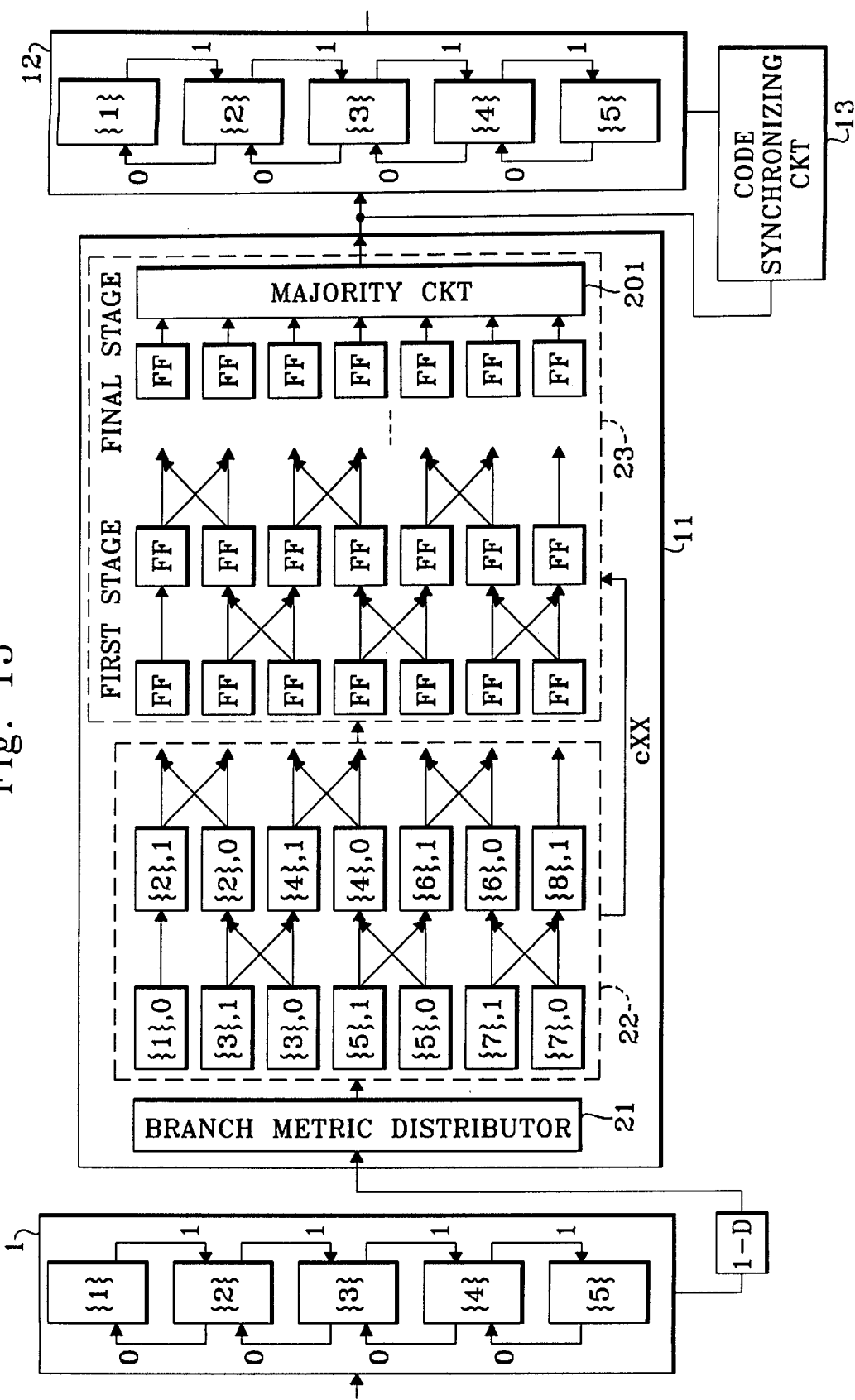
FIG. 15 is a system block diagram showing the construction of a third embodiment of the information recording and reproducing apparatus according to the present invention.

FIG. 15 is a system block diagram showing the third embodiment of the information recording and reproducing apparatus. In FIG. 15, those parts which are the same as those corresponding parts in FIG. 2 are designated by the same reference numerals, and a description thereof will be omitted.

In this embodiment, the sliding block code has 5 states, and the maximum likelihood detection circuit 11 uses 8 trellis transition states. In other words, the number of trellis transition states used by the maximum likelihood detection circuit 11 is 2 or more greater than the number of states of the sliding block code.

In FIG. 15, a judging pattern switching signal cXX supplied from the path judging unit 22 to the path memory unit 23 corresponds to the judgement results of the comparators 57 and 67 shown in FIGS. 9 and 10. In addition, a majority circuit 201 is provided within the path memory unit 23. This majority circuit 201 obtains a majority of outputs of latch circuits corresponding to the latch circuits 93-n through 143-n provided at the final stage of the path memory unit 23 shown in FIG. 12, for example. A result of the majority, that is, an output of one of the largest number of latch circuits having the same output, is supplied to the sliding block decoding circuit 12 and the code synchronizing circuit 13 as the maximum likelihood output. Accordingly, it is possible to determine the maximum likelihood output in a simple manner particularly in a case where the value of n is relatively small in FIG. 12.

Next, a description will be given of a fourth embodiment of the information recording and reproducing apparatus according to the present invention. This fourth embodiment of the information recording and reproducing apparatus employs a fourth embodiment of the maximum likelihood detection method according to the present invention. In this fourth embodiment of the information recording and reproducing apparatus, the present invention is applied to the magnetic disk unit.

Figure 16:
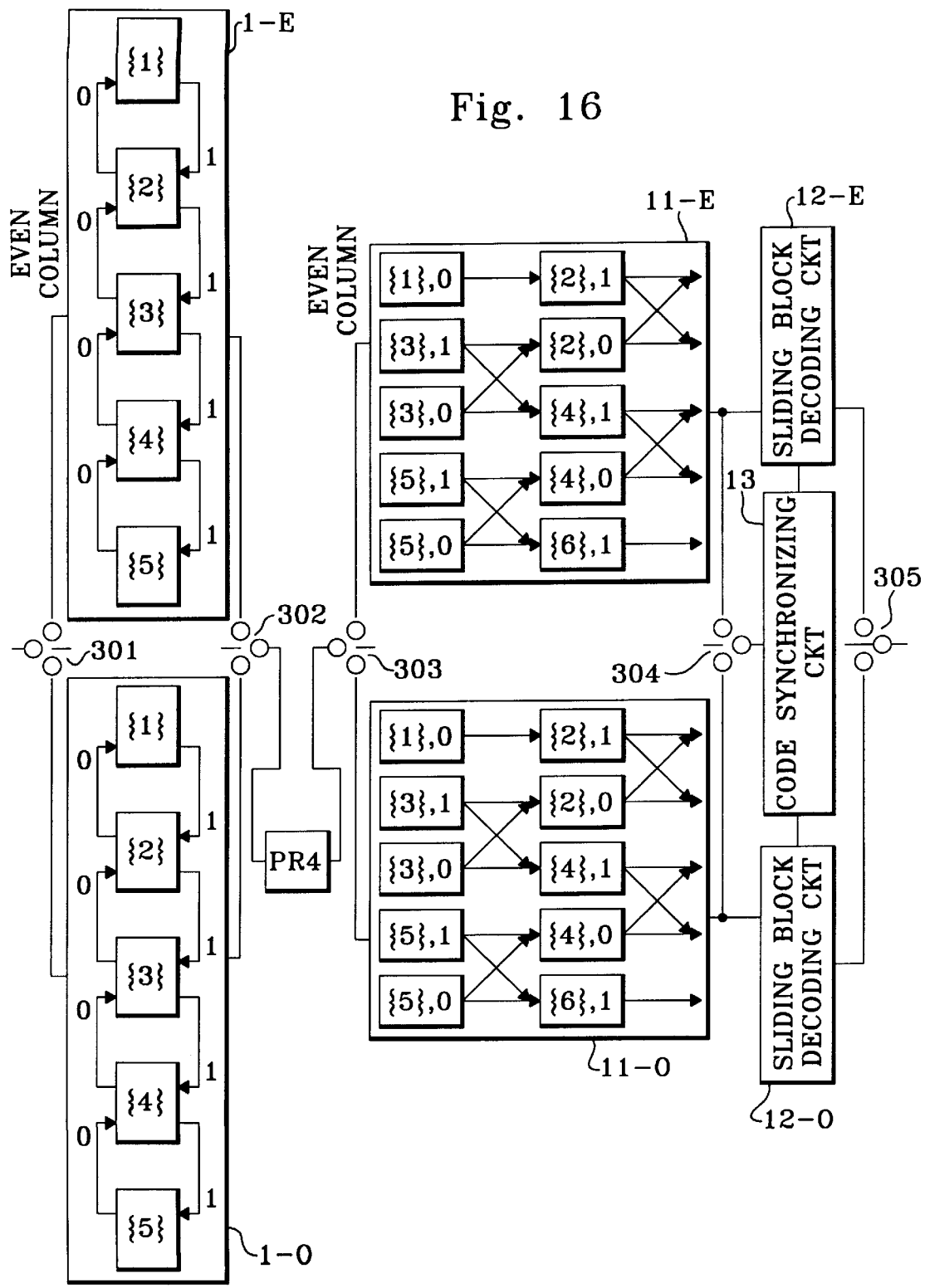
FIG. 16 is a system block diagram showing the construction of a fourth embodiment of the information recording and reproducing apparatus according to the present invention.

FIG. 16 is a system block diagram showing the fourth embodiment of the information recording and reproducing apparatus. In FIG. 16, those parts which are the same as those corresponding parts in FIG. 2 are designated by the same reference numerals, and a description thereof will be omitted.

In this embodiment, a distributor 301 distributes the input data into odd columns and even columns, and supplies odd column data to a sliding block encoding circuit 1-E and even column data to a sliding block encoding circuit 1-O. An aggregator 302 alternately outputs the code strings output from the sliding block encoding circuits 1-O and 1-E, and supplies a single code string to a class-4 partial response (PR4) recording and reproducing channel. For the sake of convenience, the illustration of the magnetic disk and the recording and reproducing heads is omitted in FIG. 16. Instead, a path made up of the magnetic disk and the recording and reproducing heads is illustrated as the (PR4) recording and reproducing channel, that is, as a partial response $(1-D^2)$ channel. The code string obtained from the (PR4) recording and reproducing channel is distributed into odd columns and even columns by a distributor 303, and the distributor 303 supplies the odd columns to a maximum likelihood detection circuit 11-O and the even columns to a maximum likelihood detection circuit 11-E. In this embodiment, the sliding block encoding circuits 1-O and 1-E respectively use the sliding block code having 5 states, and the maximum likelihood detection circuits 11-O and 11-E respectively use 6 trellis transition states.

An aggregator 304 alternately outputs the ode strings from the maximum likelihood paths detected by the maximum likelihood detection circuits 11-O and 11-E, and this output of the aggregator 304 is supplied to the code synchronizing circuit 13. The code synchronizing circuit 13 supplies to sliding block decoding circuits 12-O and 12-E code conversion signals indicating the decoding timings of the odd and even code strings from the maximum likelihood paths detected by the maximum likelihood detection circuits 11-O and 11-E. The sliding block decoding circuits 12-O and 12-E respectively decode the odd and even code strings based on the odd and even code strings from the maximum likelihood paths detected by the corresponding maximum likelihood detection circuits 11-O and 11-E and the corresponding code conversion signals obtained from the code synchronizing circuit 13. An aggregator 305 alternately outputs odd and even decoded data strings output from the sliding block decoding circuits 12-O and 12-E, so as to output a single decoded data string.

In other words, this embodiment utilizes the fact that the (PR4) recording and reproducing channel becomes the partial response $(1-D)$ channel when distributed into the odd and even columns, and interleaves the data of the odd and even columns, so that the code synchronization is achieved by converting the data into the single code string after making the maximum likelihood detection.

Next, a description will be given of a fifth embodiment of the information recording and reproducing apparatus according to the present invention. This fifth embodiment of the information recording and reproducing apparatus employs a fifth embodiment of the maximum likelihood detection method according to the present invention. In this fifth embodiment of the information recording and reproducing apparatus, the present invention is applied to the magnetic disk unit.

Figure 17:
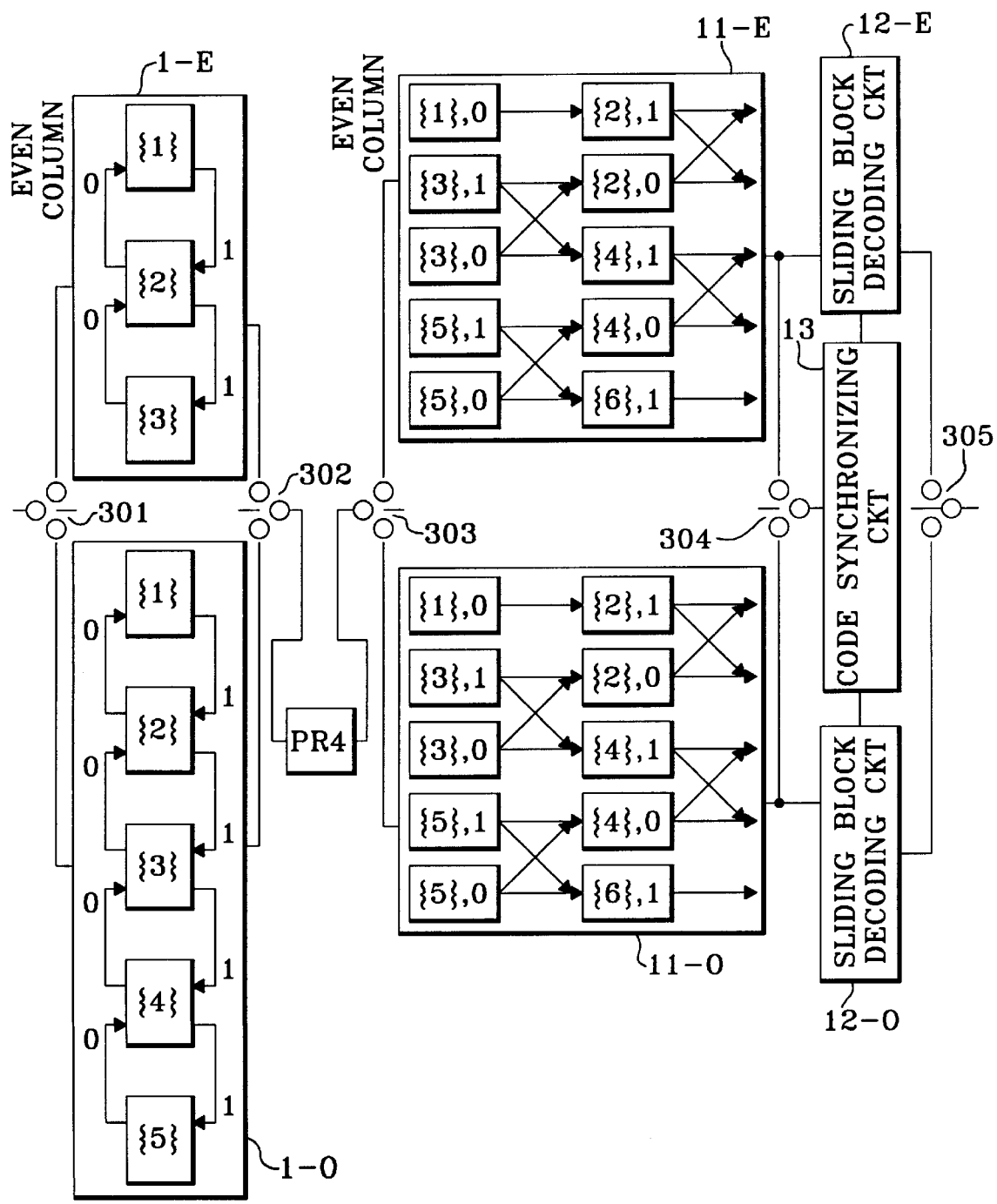
FIG. 17 is a system block diagram showing the construction of a fifth embodiment of the information recording and reproducing apparatus according to the present invention.

FIG. 17 is a system block diagram showing the fifth embodiment of the information recording and reproducing apparatus. In FIG. 17, those parts which are the same as those corresponding parts in FIG. 16 are designated by the same reference numerals, and a description thereof will be omitted.

In this embodiment, the number of states of the sliding block code is different between the sliding block encoding circuits 1-O and 1-E. In other words, the number of states of the sliding block code used in the sliding block encoding circuit 1-O is 5, and the number of states of the sliding block code used in the sliding block encoding circuit 1-E is 3. However, the number of trellis transition states used in both the maximum likelihood detection circuits 11-O and 11-E is 6 which is larger than the number of states of the sliding block code used in each of the sliding block encoding circuits 1-O and 1-E.

According to this embodiment, it is possible to vary the encoding rate by utilizing combinations of the numbers of states of the sliding block codes.

Of course, the second embodiment described above is applicable to any of the third through fifth embodiments described above.

In addition, although the present invention is applied to the magnetic disk unit in each of the embodiments described above, the information recording and reproducing apparatus is not limited to the magnetic disk unit. In other words, the present invention is similarly applicable to other information recording and reproducing apparatuses such as optical disk units and magneto-optic disk units, information recording and reproducing apparatuses which record and reproduce information with respect to recording mediums other than disks, and the like.

Further, the present invention is not limited to these embodiments, but various variations and modifications may be made without departing from the scope of the present invention.

What is claimed is:

1. A maximum likelihood detection method for detecting a maximum likelihood path using trellis transitions when decoding a code string which is obtained by encoding data by a sliding block code employing trellis-coded partial response (TCPR) technique, said maximum likelihood detection method comprising the steps of:

(a) inputting said code used for the encoding string; and (b) detecting a maximum likelihood path with respect to said code string from state transition paths using a number of trellis transition states one greater than a number of states of a state transition pattern of the sliding block code.

2. The maximum likelihood detection method as claimed in claim 1, wherein said step (b) detects the maximum likelihood path asynchronously to a synchronizing word included in said code string.

3. The maximum likelihood detection method as claimed in claim 2, which further comprises the steps of:

(c) detecting synchronization based on said synchronizing word; and (d) deleting a virtual state transition path which actually does not exist after the synchronization is detected in said step (c).

4. A maximum likelihood detection method for detecting a maximum likelihood path using trellis transitions when decoding a code string which is obtained by encoding data by a sliding block code employing trellis-coded partial response (TCPR) technique, said maximum likelihood detection method comprising the steps of:

(a) inputting said code string:

(b) detecting a maximum likelihood path with respect to said code string from state transition paths using a number of trellis transition states greater than a number of states of a state transition pattern of the sliding block code used for the encoding; and (c) distributing said code string into odd and even columns, said step (b) detecting 2 maximum likelihood paths with respect to the odd and even columns of said code string respectively from the state transition paths using a number of trellis transition states greater than the number of states of the state transition pattern of the sliding block code.

5. The maximum likelihood detection method as claimed in claim 4, which further comprises the steps of:

(d) alternately outputting code strings of the odd and even columns from the 2 maximum likelihood paths detected by said step (b) to aggregate the code strings into a single code string.

6. An information recording and reproducing apparatus comprising:

encoding means for encoding data by a sliding block code employing trellis-coded partial response (TCPR) technique and outputting a code string;

recording and reproducing means for recording said code string on a recording medium and reproducing the code string from the recording medium;

maximum likelihood detection means for detecting a maximum likelihood path from state transition paths using a number of trellis transition states one greater than a number of states of a state transition pattern of the sliding block code used in said encoding means with respect to the code string reproduced from the recording medium by said recording and reproducing means; and decoding means for decoding the code string from the maximum likelihood path detected by said maximum likelihood detection means and outputting decoded data.

7. The information recording and reproducing apparatus as claimed in claim 6, wherein said maximum likelihood detection means detects the maximum likelihood path asynchronously to a synchronizing word included in the code string from said recording and reproducing means.

8. The information recording and reproducing apparatus as claimed in claim 7, wherein said maximum likelihood detection means includes means for deleting a virtual state transition path which actually does not exist after synchronization is detected based on said synchronizing word.

9. The information recording and reproducing apparatus as claimed in claim 6, wherein said recording and reproducing means uses a partial response (1-D) channel.

10. An information recording and reproducing apparatus comprising:

encoding means for encoding data by a sliding block code employing trellis-coded partial response (TCPR) technique and outputting a code string;

recording and reproducing means for recording said code string on a recording medium and reproducing the code string from the recording medium;

maximum likelihood detection means for detecting a maximum likelihood path from state transition paths using a number of trellis transition states greater than a number of states of a state transition pattern of the sliding block code used in said encoding means with respect to the code string reproduced from the recording medium by said recording and reproducing means;

decoding means for decoding the code string from the maximum likelihood path detected by said maximum likelihood detection means and outputting decoded data; and distributing means for distributing said code string into odd and even columns, said maximum likelihood detection means detecting 2 maximum likelihood paths with respect to the odd and even columns of said code string respectively from the state transition paths using a number of trellis transition states greater than the number of states of the state transition pattern of the sliding block code.

11. The information recording and reproducing apparatus as claimed in claim 10, which further comprises:

aggregating means for alternately outputting code strings of the odd and even columns from the 2 maximum likelihood paths detected by said maximum likelihood detection means and aggregating the code strings into a single code string.

12. The information recording and reproducing apparatus as claimed in claim 10, wherein said recording and reproducing means uses a class-4 partial response recording and reproducing channel.

13. An information recording and reproducing apparatus comprising:

encoding means for encoding data by a sliding block code employing trellis-coded partial response (TCPR) technique and outputting a code string;

recording and reproducing means for recording said code string on a recording medium and reproducing the code string from the recording medium;

maximum likelihood detection means for detecting a maximum likelihood path from state transition paths using a number of trellis transition states greater than a number of states of a state transition pattern of the sliding block code used in said encoding means with respect to the code string reproduced from the recording medium by said recording and reproducing means; and decoding means for decoding the code string from the maximum likelihood path detected by said maximum likelihood detection means and outputting decoded data, said encoding means comprising:

first means for distributing the data into odd and even columns when decoding the data;

second means for independently encoding the data of the odd and even columns by a sliding block code; and third means for aggregating code strings of the odd and even columns to output a single code string.

14. The information recording and reproducing apparatus as claimed in claim 13, wherein said second means uses sliding block codes having a mutually different number of state transition patterns with respect to the data of the odd column and the data of the even column.

* * * * *

UNITED STATES PATENT AND TRADEMARK OFFICE
CERTIFICATE OF CORRECTION

PATENT NO. : 6,003,153
DATED : December 14, 1999
INVENTOR(S) : Shimoda

Page 1 of 1

It is certified that error appears in the above-identified patent and that said Letters Patent is hereby corrected as shown below:

<u>Column 13,</u>
Line 31, delete "string:" and insert -- string; -- therefor
Line 8, delete "used for the encoding"
Line 13, after "block code" insert -- used for the encoding --

Signed and Sealed this

Twenty-first Day of August, 2001

Attest:

*Nicholas P. Godici*

NICHOLAS P. GODICI
*Attesting Officer*  *Acting Director of the United States Patent and Trademark Office*